(12) United States Patent
Bhagavat et al.

(10) Patent No.: US 11,018,125 B2
(45) Date of Patent: May 25, 2021

(54) MULTI-CHIP PACKAGE WITH OFFSET 3D STRUCTURE

(71) Applicant: Advanced Micro Devices, Inc., Santa Clara, CA (US)

(72) Inventors: Milind S. Bhagavat, Broomfield, CO (US); Rahul Agarwal, Livermore, CA (US); Gabriel H. Loh, Bellevue, WA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/927,111

(22) Filed: Jul. 13, 2020

(65) Prior Publication Data

US 2020/0343236 A1 Oct. 29, 2020

Related U.S. Application Data

(62) Division of application No. 15/961,123, filed on Apr. 24, 2018, now Pat. No. 10,714,462.

(51) Int. Cl.
*H01L 23/00* (2006.01)
*H01L 25/18* (2006.01)
(Continued)

(52) U.S. Cl.
CPC .......... *H01L 25/18* (2013.01); *H01L 23/4334* (2013.01); *H01L 23/49816* (2013.01); *H01L 23/49827* (2013.01); *H01L 23/5389* (2013.01); *H01L 25/50* (2013.01); *H01L 24/08* (2013.01); *H01L 24/16* (2013.01); *H01L 24/29* (2013.01); *H01L 24/32* (2013.01); *H01L 24/80* (2013.01); *H01L 2224/08225* (2013.01); *H01L 2224/16238* (2013.01); *H01L 2224/29188* (2013.01);
(Continued)

(58) Field of Classification Search
None
See application file for complete search history.

(56) References Cited

U.S. PATENT DOCUMENTS 9,607,967 B1 3/2017 Shih
2007/0296079 A1\* 12/2007 Huang ................ H01L 23/4334
257/712
(Continued)

FOREIGN PATENT DOCUMENTS

CN 106558574 A 4/2017

OTHER PUBLICATIONS

TechPowerUp GPU Database; *NVIDIA Tesla P100 SXM2*; https://www.techpowerup.com/gpudb/2835/tesla-p100-sxm2; Mar. 12, 2018; pp. 1-4.
(Continued)

*Primary Examiner* — Reema Patel (57) ABSTRACT

Various semiconductor chip devices and methods of manufacturing the same are disclosed. In one aspect, a semiconductor chip device is provided that has a reconstituted semiconductor chip package that includes an interposer that has a first side and a second and opposite side and a metallization stack on the first side, a first semiconductor chip on the metallization stack and at least partially encased by a dielectric layer on the metallization stack, and plural semiconductor chips positioned over and at least partially laterally overlapping the first semiconductor chip.

22 Claims, 9 Drawing Sheets

(51) Int. Cl.
  *H01L 23/538* (2006.01)
  *H01L 23/498* (2006.01)
  *H01L 25/00* (2006.01)
  *H01L 23/433* (2006.01)

(52) U.S. Cl.
  CPC ............... *H01L 2224/32225* (2013.01); *H01L 2224/8089* (2013.01); *H01L 2224/80801* (2013.01); *H01L 2224/80905* (2013.01)

(56) References Cited

U.S. PATENT DOCUMENTS

| | | | |
|---|---|---|---|
| 2010/0216410 A1 | 8/2010 | Liu et al. | |
| 2011/0084373 A1 | 4/2011 | Choi et al. | |
| 2014/0175673 A1* | 6/2014 | Kim | H01L 24/73 257/777 |
| 2014/0203457 A1 | 7/2014 | Kim et al. | |
| 2015/0070863 A1 | 3/2015 | Yun et al. | |
| 2015/0255427 A1 | 9/2015 | Sung et al. | |
| 2015/0311182 A1 | 10/2015 | Hwan et al. | |
| 2016/0260695 A1 | 9/2016 | Chung et al. | |
| 2017/0018534 A1 | 1/2017 | Miki | |
| 2017/0194290 A1 | 7/2017 | Yu et al. | |
| 2017/0301650 A1 | 10/2017 | Yu et al. | |
| 2019/0273044 A1 | 9/2019 | Fu et al. | |

OTHER PUBLICATIONS

Sandeep Kumar Samal et al.; *Adaptive Regression-Based Thermal Modeling and Optimization for Monolithic 3-D ICs*; IEEE Transactions on Computer-Aided Design of Integrated Circuits and Systems; vol. 35; No. 10; Oct. 2016; pp. 1707-1720.
PCT/US2019/024826 International Search Report dated Oct. 25, 2019.

* cited by examiner

FIG. 16

MULTI-CHIP PACKAGE WITH OFFSET 3D STRUCTURE

This application is a divisional of Ser. No. 15/961,123, filed Apr. 24, 2018.

BACKGROUND OF THE INVENTION

A conventional type of multi-chip module includes a processor chip and four memory chips mounted side-by-side on an interposer (so-called "2.5D") that is, in-turn, mounted on a ball grid array (BGA) package substrate. The memory chips are arranged around the periphery of the processor chip. The processor chip and the memory chips are mounted on the interposer and interconnected thereto by respective pluralities of solder joints. The interposer and the package substrate are provided with plural electrical pathways to provide input/output pathways for the semiconductor chips both for inter-chip power, ground and signal propagation as well as input/output from the interposer itself. The semiconductor chips include respective underfill material layers to lessen the effects of differential thermal expansion due to differences in the coefficients of thermal expansion of the chips, the interposer and the solder joints. The interposer is manufactured with multitudes of through-silicon vias (TSVs) to provide pathways between the mounted chips and a package substrate upon which the interposer is mounted. The TSVs and traces are fabricated using large numbers of processing steps.

Although conventional BGA sockets come in many shapes and sizes, there are typically various industry standard sizes and pin outs. Once settled upon, these standard sizes are used over time, sometimes in multitudes of different devices, such as computers, handheld devices and other electronic devices. One example of a conventional BGA socket is an Nvidia SMX2.

Another conventional multi-chip module technology is 2D wafer-level fan-out (or 2D WLFO). Conventional 2D WLFO technology is based on embedding die into a molded wafer, also called "wafer reconstitution." The molded wafer is processed through a standard wafer level processing flow to create the final integrated circuit assembly structure. The active surface of the dies are coplanar with the mold compound, allowing for the "fan-out" of conductive copper traces and solder ball pads into the molded area using conventional redistribution layer (RDL) processing. Conventional 3D WLFO extends the 2D technology into multi-chip stacking where a second package substrate is mounted on the 2D WLFO.

BRIEF DESCRIPTION OF THE DRAWINGS

The foregoing and other advantages of the invention will become apparent upon reading the following detailed description and upon reference to the drawings in which.

DETAILED DESCRIPTION

One conventional multi-chip module variant includes side-by-side processor and memory chips in a 2.5D arrangement on a silicon interposer that is, in-turn, mounted on a package substrate. The conventional package substrate is manufactured with a footprint and pin out tailored for a particular type of BGA socket. In other words, the size and shape of the package substrate is, to a large extent, dictated by the mechanical properties, size, etc. of the socket. Performance of a given multi-chip module can be often increased by incorporating additional memory chips into the module that cooperate with processor(s) or system-on-chip chips. However, packing additional memory chips into a multi-chip module designed for a standard socket and attendant package substrate, is a technical challenge. One conventional solution is to simply increase the size of both the interposer and the package. Of course this technique almost always involves a redesign of the socket, which will require the redesign and configuration of the multitudes of different types of circuit boards that use the originally adopted standard socket.

The disclosed embodiments solve the issue of incorporating additional chips in a multi-chip module by stacking the somewhat smaller chips over a larger processor or other type of integrated circuit and at least partially laterally overlapping the upper chips with the lower chip all without having to substantially change the physical footprints of the underlying interposer and the package substrate. In this way, additional memory devices or other types of integrated circuits can be incorporated into a multi chip module while preserving the ability to use existing socket sizes and designs.

In accordance with one aspect of the present invention, a semiconductor chip device is provided that has a reconstituted semiconductor chip package that includes an interposer that has a first side and a second and opposite side and a metallization stack on the first side, a first semiconductor chip on the metallization stack and at least partially encased by a dielectric layer on the metallization stack, and plural semiconductor chips positioned over and at least partially laterally overlapping the first semiconductor chip.

In accordance with another aspect of the present invention, a semiconductor chip package is provided that includes a semiconductor chip package substrate adapted to mount in a circuit board socket and a reconstituted semiconductor chip package mounted on the semiconductor chip package substrate. The reconstituted semiconductor chip package includes an interposer that has a first side and a second and opposite side and a metallization stack on the first side, a first semiconductor chip on the metallization stack and at least partially encased by a dielectric layer on the metallization stack, and plural semiconductor chips positioned over and at least partially laterally overlapping the first semiconductor chip.

In accordance with another aspect of the present invention, a method of manufacturing a semiconductor chip device is provided. The method includes fabricating a reconstituted semiconductor chip package that has an interposer that includes a first side and a second and opposite side and a metallization stack on the first side, a first semiconductor chip on the metallization stack and at least partially encased by a dielectric layer on the metallization stack, and plural semiconductor chips positioned over and at least partially laterally overlapping the first semiconductor chip.

Figure 1:
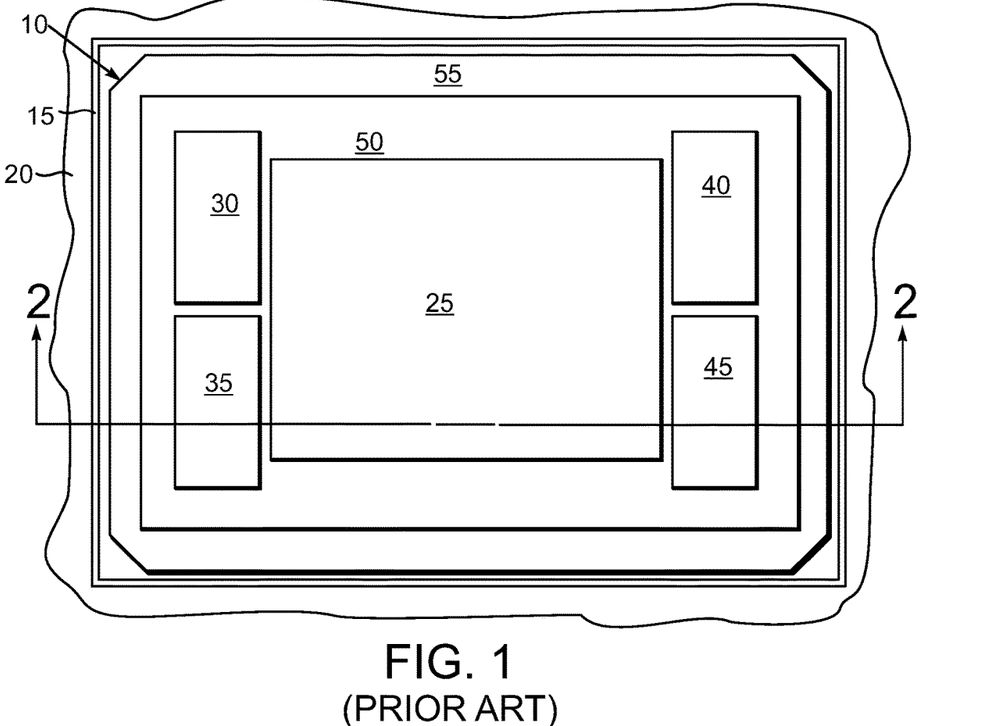
FIG. 1 is a plan view of an exemplary conventional semiconductor chip package mounted in a conventional socket on a circuit board.
Figure 2:
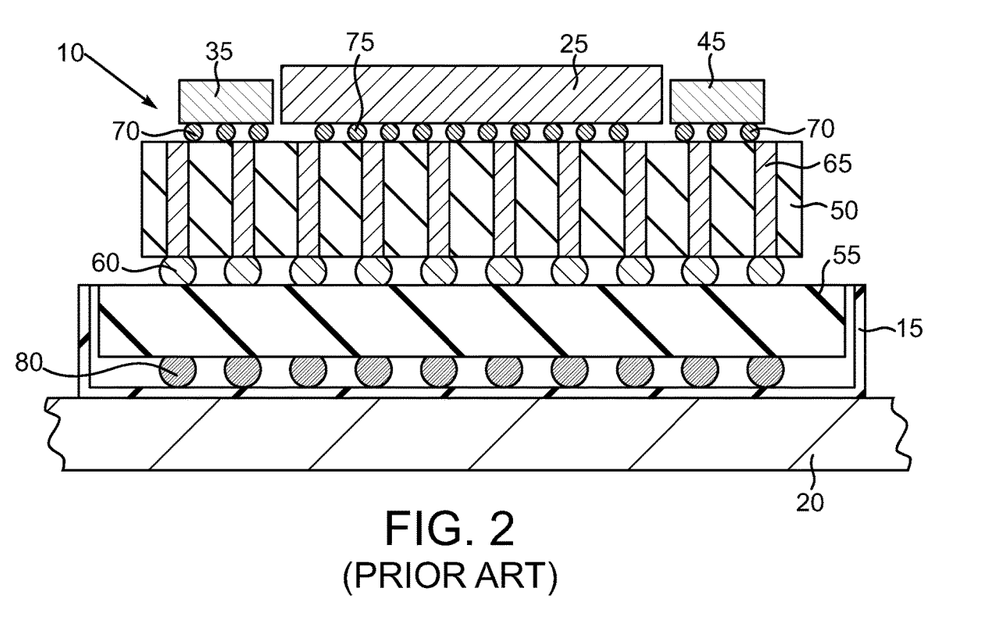
FIG. 2 is a sectional view of FIG. 1 taken at section 2-2.

In the drawings described below, reference numerals are generally repeated where identical elements appear in more than one figure. Turning now to the drawings, and in particular to FIG. 1 which is a plan view of an exemplary conventional semiconductor chip package 10 mounted in a socket 15 of a system board 20. Note that only a portion of the system board 20 is depicted. The conventional package includes a processor chip 25 and four memory chips 30, 35, 40 and 45 all mounted on an underlying interposer 50, which is in turn mounted on a package substrate 55. Additional details of the conventional semiconductor chip package 10 and the socket 15 may be understood by referring now also to FIG. 2 which is a sectional view of FIG. 1 taken at section 2-2. Note that because of the location of section 2-2, the semiconductor chip 25 and the semiconductor chips 35 and 45 are shown in section along with the underlying interposer 50, the package substrate 55, the socket 15 and the system board 20. In this illustrative conventional arrangement, the socket 15 can be a BGA socket that has a particular footprint or area and the package substrate 55 is sized to fit within the footprint of the socket 15. The conventional package 10 only utilizes four memory chips 30, 35, 40 and 45 in a 2.5D arrangement and with the use of the interposer 50 to provide electrical pathways between the chips 30, 35, 40 and 45 and the chip 25. The interposer 50 is constructed of a silicon substrate and provided with plural interconnects 60, which are typically solder balls or bumps and plural through-substrate conductors or vias 65 that are designed to connect from the bumps 60 up to respective solder bumps 70 of the chips 35 and 40 and additional solder bumps 75 of the semiconductor chip 25. The chip 25 and the chips 30, 35, 40 and 45 have particular sizes and footprints which can be changed over time, albeit at significant effort and expense. The package substrate 55 further includes plural interconnects 80, which are solder balls in this illustrative conventional arrangement.

Figure 3:
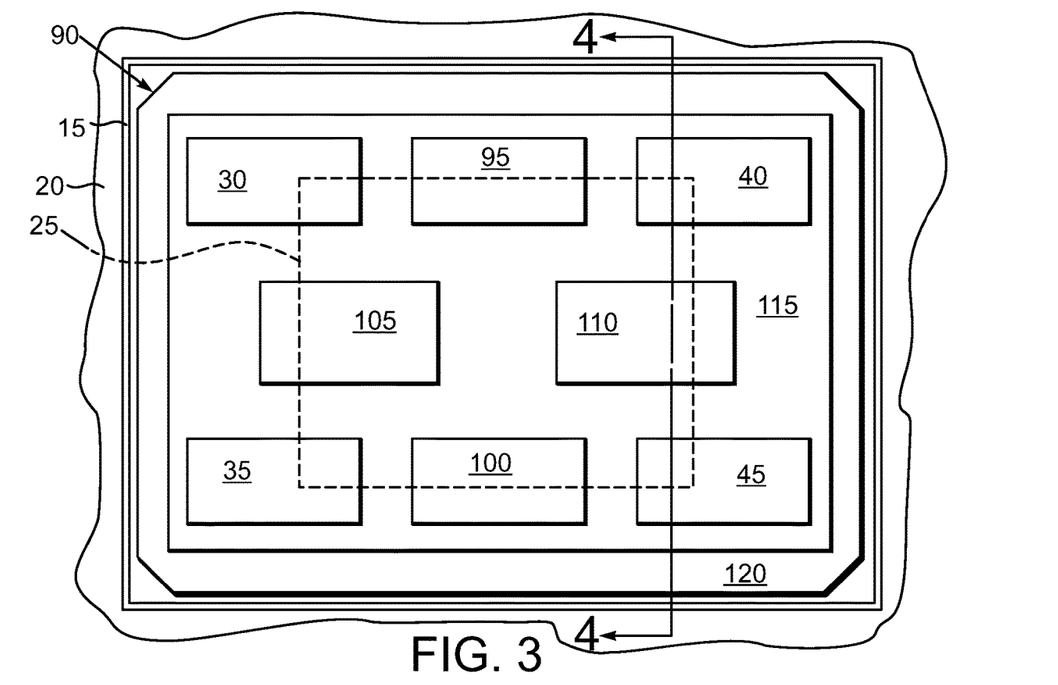
FIG. 3 is a plan view of an exemplary new arrangement of a semiconductor chip package mounted in a socket.
Figure 4:
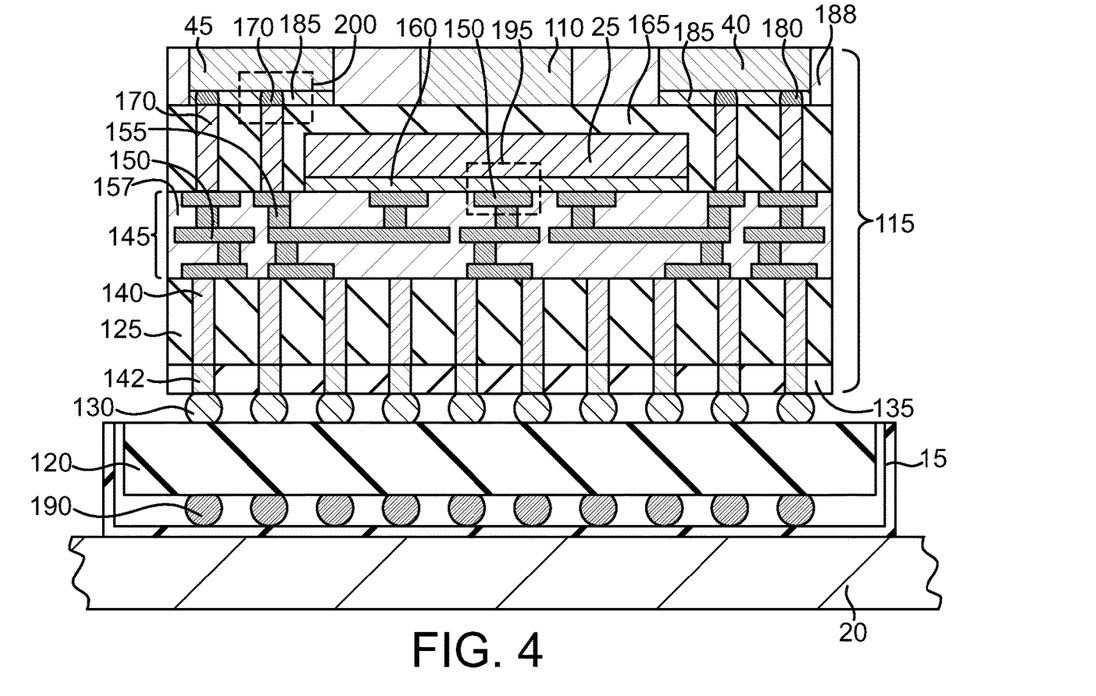
FIG. 4 is a sectional view of FIG. 3 taken at section 4-4.

A new exemplary arrangement of a semiconductor chip device 90 can be understood by referring now to FIGS. 3 and 4. FIG. 3 is a plan view like FIG. 1, but showing the exemplary new semiconductor chip device 90 positioned in the aforementioned socket 15 of the system board 20 and FIG. 4 is a sectional view of FIG. 3 taken at section 4-4. Note that because of the location of section 4-4, the chips 40 and 45, the dummy component 110 as well as the chip 25 of the reconstituted package 115 are shown in section. Here, the chip device 90 includes the semiconductor chip 25 (shown in dashed for reasons to be explained in a moment), as well as the semiconductor chips 30, 35, 40 and 45 and two or more additional chips 95 and 100 and optional dummy components 105 and 110 coupled together in a reconstituted package 115. The reconstituted package 115 is, in turn, mounted on an underlying circuit board 120, which can be a package substrate 120 or other. The circuit board 120 is preferably constructed to have a footprint that corresponds to the footprint of the socket 15. However, by using the reconstituted package 115, more than just the four memory chips 30, 35, 40 and 45, i.e., the chips 30, 35, 40 and 45 plus the chips 95 and 100, can be grouped together with the chip 25 but with the same package footprint as the conventional package 10 shown in FIGS. 1 and 2. As noted above briefly, the chip 25 is shown in dashed because it is positioned beneath the chips 30, 35, 40, 45, 95 and 100 in the reconstituted package 115 and thus is not strictly visible in FIG. 3, but of course is visible in section in FIG. 4. Note that by positioning the chip 25 beneath the chips 30, 35, 40, 45, 95 and 100 and by at least partially overlapping the chips 30, 35, 40, 45, 95 and 100 laterally with the chip 25, the additional memory chips 95 and 100 can be grouped with the chip 25 in the same overall footprint for a package. Here the chips 30, 35, 40, 45, 95 and 100 number six and are arranged symmetrically around the perimeter of the chip 25. However, other numbers and symmetric or asymmetric arrangements are possible.

As shown in FIG. 4, the reconstituted package 115 includes an interposer 125 composed of silicon, germanium, silicon-on-insulator or other interposer materials. The interposer 125 electrically interfaces with the circuit board 120 by way of plural I/Os 130, which can be solder bumps, balls or other types of interconnect structures. To provide stress relief, a lower surface of the interposer 125 can include a polymer layer 135 composed of polybenzoxazoles, although other polymeric materials could be used, such as benzocyclobutene, high or low temperature polyimide or other polymers. Plural through substrate vias (TSV) 140 are formed in the interposer 125 and electrically connected to the I/Os 130. Underbump metallization (UBM) 142 is preferably formed on the lower ends of the TSVs 140. The UBM 142 can be constructed of a variety of metals that provide solder adhesion, barrier and dielectric adhesion properties. One arrangement includes a barrier/adhesion layer of Ti—W and copper followed by a copper layer, a nickel layer and another copper layer to interface with solder. A metallization stack 145 is formed on the interposer 125 and consists of one or more layers of conductor traces 150 and conductive vias 155. The various traces 150 and vias 155 are interspersed with plural dielectric layers 157 composed of silicon oxide or other types of dielectric materials deposited by CVD with or without plasma enhancement. The semiconductor chip 25 is mounted on the metallization stack 145 and an interconnect portion 160 thereof is bonded to not only some of the dielectric of the metallization stack 145 but also to some of the conductor traces 150 by way of an oxide hybrid bond process to be described in more detail below.

The semiconductor chips 25, 30, 35, 40, 45, 95 and 100 can be any of a variety of integrated circuits. A non-exhaustive list of examples includes microprocessors, graphics processing units, application processing units that combines aspects of both, memory devices, an application integrated specific circuit or other. In one arrangement, the semiconductor chip 25 can be a processor and the semiconductor chips 30, 35, 40, 45, 95 and 100 can be memory chips, such as DRAM, SRAM or other. The circuit board 120 can be organic or ceramic and single, or more commonly, multilayer. Variations include package substrates, system boards, daughter boards, circuit cards and others.

The semiconductor chip 25 is encased in a dielectric layer 165 which is preferably composed of silicon oxide deposited by low temperature PECVD or another suitable process. Through dielectric vias (TDVs) 170 are formed in the dielectric film 165 and connected electrically with some of the traces 150 of the metallization stack 145 and also to respective I/Os 175 and 180 of the chips 40 and 45. Additional details of the metallurgical connection between the I/Os 175 and 180 and through dielectric vias 170 will be described in conjunction with a subsequent figure. The gaps between the semiconductor chips 40 and 45 and the dielectric film 165 can be filled with an underfill 185 which can be well-known polymeric underfill materials. The dummy component 110 can be a substrate of silicon, germanium, or other type of semiconductor or even a dielectric material and serves as a heat transfer avenue for conducting heat away from the chip 25 and other components of the reconstituted package 115. The dummy component 110 can be secured to the dielectric film 165 by adhesives, oxide-oxide bonds or other types of joining techniques. Finally, the chips 40 and 45 and the dummy component 110 are at least partially encased in a molding layer 188 that is roughly coterminous vertically with the upper surfaces of the chips 40, 45 and the dummy component 110. In an exemplary arrangement the material(s) for the molding layer 188 can have a molding temperature of about 165° C. Two commercial variants are Sumitomo EME-G750 and G760.

The circuit board 120 can interface electrically with the socket 15 by way of the illustrated solder balls 190, optionally, pin grid arrays or land grid arrays or even other types of board to socket connections can be used. Indeed, in other arrangements, a socketless connection can be used. The solder balls 190, the I/Os 130 and the I/Os 175 and 180 can be solder structures, conductive pillars or combinations of the two. Well-known solder compositions, such as tin-silver, tin-silver-copper or others could be used. The TSVs 140, the traces 150, the vias 155 and the TDVs 170 (and any related disclosed conductors, such as pillars and pads) can be composed of various conductor materials, such as copper, aluminum, silver, gold, platinum, palladium or others.

Note the location of the dashed rectangle 195 in FIG. 4. The portion of the dashed rectangle 195 will be shown at greater magnification in FIG. 5. Also note the location of the dashed rectangle 200 in FIG. 4. The portion of FIG. 4 circumscribed by the dashed rectangle 200 will be shown at greater magnification in FIG. 6.

Figure 5:
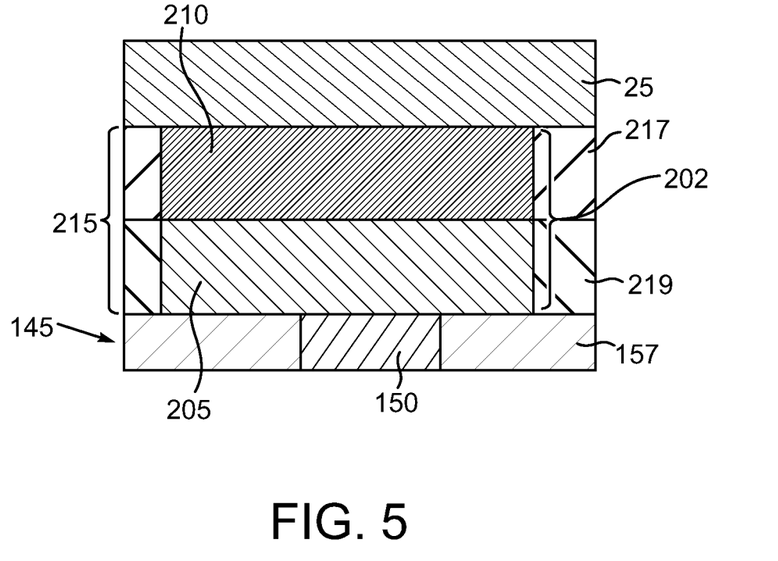
FIG. 5 is a portion of FIG. 4 shown at greater magnification.

Attention is now turned to FIG. 5, which as just noted, is the portion of FIG. 4 circumscribed by the dashed rectangle 195. As noted above, the interconnect portion 160 of the semiconductor chip 25 is joined to the metallization stack 145 by way of a bumpless oxide hybrid bonding technique. In this regard, an interconnect 202 between the semiconductor chip 25 and the metallization stack 145 is made up of a metallurgical bond between a bond pad 205 of the metallization stack 145 and a bond pad 210 of the chip 25. The interconnect 202 is bumpless and one of many. The bond pad 150 is connected or otherwise part of the trace 150. In addition, an insulating bonding layer 215 joins the chip 25 to the metallization stack 145 and consists of a glass layer 217, such as SiOx, of the semiconductor chip 45 and another glass layer 219, such as silicon oxynitride, of the metallization stack 145. The bond pad 205 is positioned in the glass layer 219 and the bond pad 210 is positioned in the glass layer 217. The bond pad 205 and the bond pad 210 are metallurgically bonded by way of an anneal process. In this regard, the semiconductor chip 25 is brought down or otherwise positioned on the metallization stack 145 so that the glass layer 217 is on or in very close proximity to the glass silicon oxynitride layer 219 and the bond pad 210 is on or in very close proximity to the bond pad 205. Thereafter, an anneal process is performed, which produces a transitory thermal expansion of the bond pads 210 and 205 bringing those structures into physical contact and causing them to form a metallurgical bond that persists even after the chip 25 and metallization stack 145 are cooled and the bond pads 210 and 205 contract thermally. Copper performs well in this metal bonding process, but other conductors could be used. There is also formed an oxide/oxynitride bond between the glass layer 217 and the glass layer 219.

Figure 6:
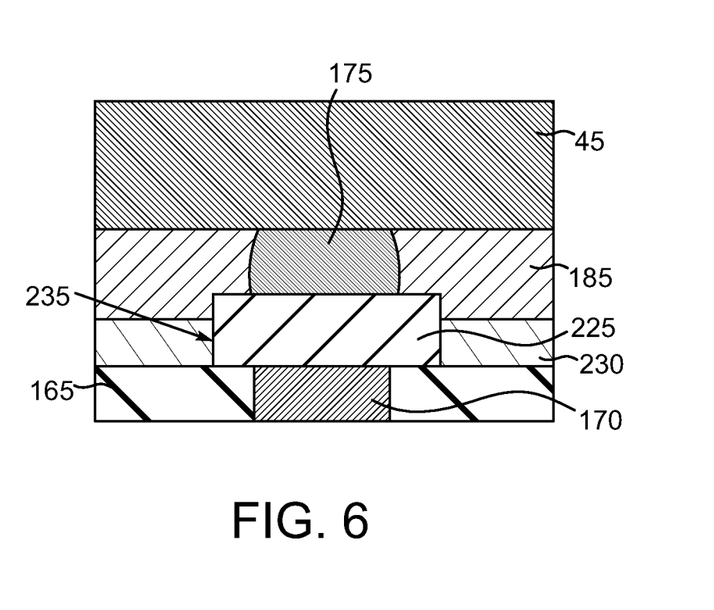
FIG. 6 is another portion of FIG. 4 shown at greater magnification.

Additional details of the electrical connections between the TDVs 170 and the chips 40 and 45 can be understood by referring now to FIG. 6, which as noted above, is the portion of FIG. 4 circumscribed by the dashed rectangle 200. Note that a portion of one of the TDVs 170 as well as the dielectric layer 165 are depicted. A conductive pillar 225 is formed on and in ohmic contact with one of the TDVs 170 and projects vertically upward beyond a dielectric film 230 composed of silicon oxide or other materials. The dielectric film 230 includes a suitable opening 235 formed therein to accommodate the conductive pillar 225. The conductive pillar 225 is advantageously formed by plating material into the opening 235 through a suitable mask (not shown) or by way of material deposition and lithographic patterning as desired. The I/O 175 of the chip 45 is preferably a solder bump or micro bump and metallurgically connected to the conductive pillar 225 by way of contact and solder reflow. Optionally, the I/O 175 can be another conductive pillar that is joined to the conductive pillar 225 by thermal bonding or by a solder cap as desired. As noted above, the underfill 185 is deposited between the chip 45 and the dielectric layer 165 using capillary techniques and to alleviate issues of CTE mismatch. Optionally a molded underfill could be used.

Figure 7:
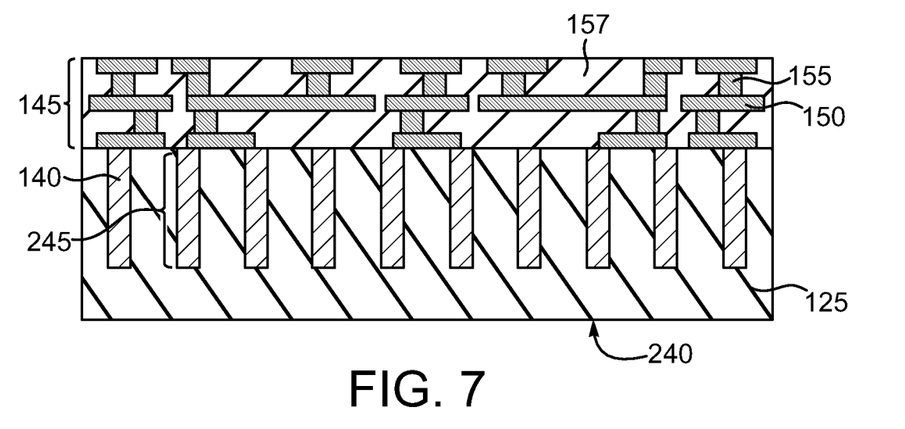
FIG. 7 is a sectional view depicting some processing of an interposer and fabrication of a metallization stack thereon.

An exemplary process flow for fabricating the reconstituted package 115 can be understood by referring now to FIGS. 7, 8, 9, 10, 11, 12, 13 and 14 and initially to FIG. 7, which is a sectional view depicting the interposer 125 following the fabrication of the metallization stack 145 thereon. This is preferably, though not necessarily, a wafer level process wherein the reconstituted package 115 is part of a reconstituted wafer (not shown) that eventually undergoes singulation. Note that the TSVs 140 have been fabricated but the interposer 125 has not undergone a thinning process at the backside 240 thereof to reveal the TSVs 140. The metallization stack 145 can be constructed by using well-known material deposition and patterning processes to establish the conductive traces 150, the vias 155 and one or more interlevel dielectric films 157. The TSVs 140 can be formed in corresponding openings 245 formed in the interposer 125 by way of suitable masking and etching. The TSVs 140 can be formed by well-known plating or sputtering or other material deposition processes and can be constructed of the conductor materials disclosed elsewhere herein. If desired, one or more barrier films can be deposited in the openings 245 prior to the deposition or otherwise placement of the bulk conductor materials. Barriers such as titanium nitride or the like can be used.

Figure 8:
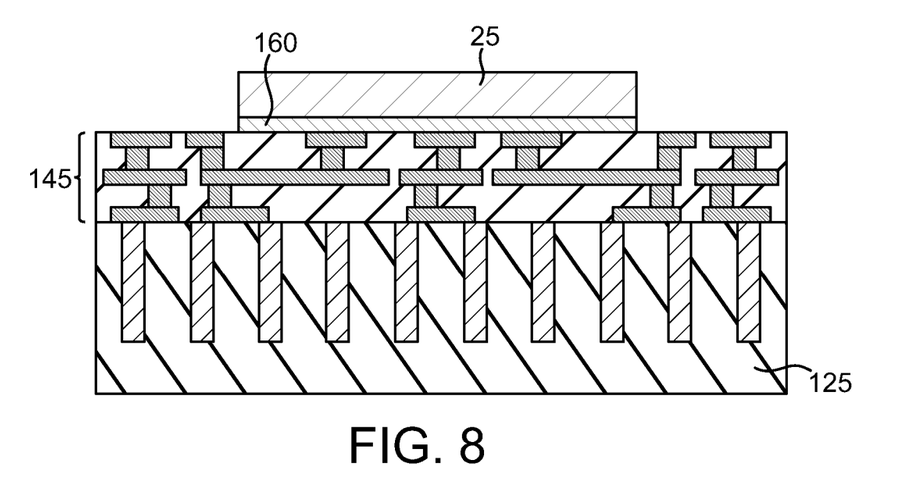
FIG. 8 is a sectional view like FIG. 7 but depicting exemplary mounting of a semiconductor chip on the metallization stack.
Figure 9:
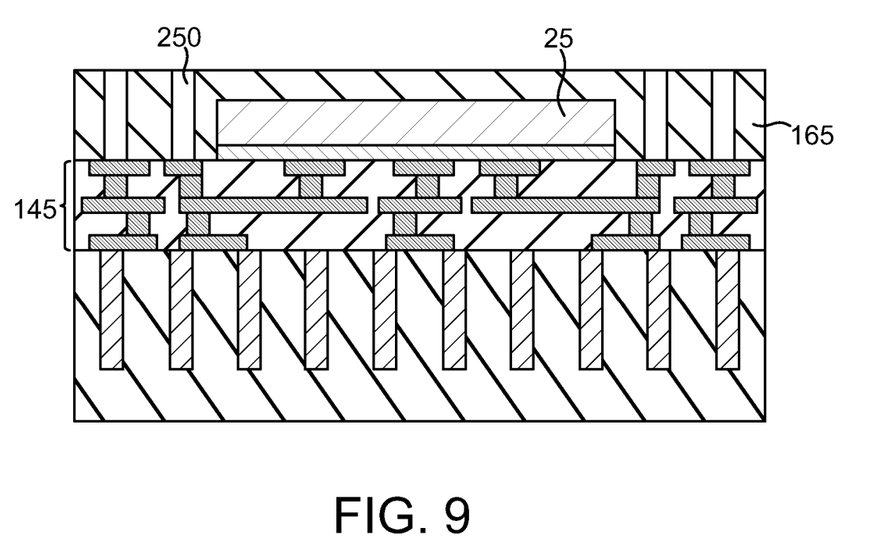
FIG. 9 is a sectional view like FIG. 8 but depicting exemplary dielectric layer fabrication at least partially encasing the semiconductor chip.
Figure 10:
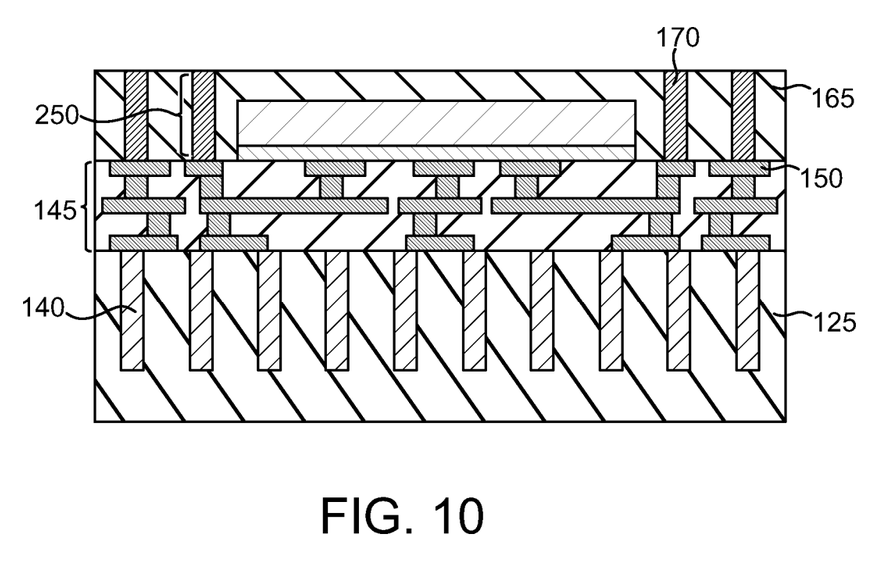
FIG. 10 is a sectional view like FIG. 9 depicting through-dielectric via fabrication.

Next and as shown in FIG. 8, the semiconductor chip 25 is mounted on the metallization stack 145 by way of the hybrid oxide bonding process involving the interconnect portion 160 of the chip 25 and the process described above in conjunction with FIG. 5. The interposer 125 remains unthinned at this point. Next and as shown in FIG. 9, the dielectric layer 165 is formed on the metallization stack 145 and encases the semiconductor chip 25 at this point. Plural openings 250 are formed in the dielectric film 165 in anticipation of subsequent fabrication of the TDVs 170. As shown in FIG. 10, the TDVs 170 are formed in the openings 250 of the dielectric film 165 using suitable masking and directional dry etching. The formation of the TDVs 170 can be very similar to the formation of the TSVs 140 described above. In this regard, following the fabrication of the openings 250, one or more barrier layers, such as titanium nitride, Ti—W or the like can be followed by a two-step plating process involving first the application of a copper seed layer and then a copper bulk layer. Of course if other conductor materials are used then corresponding processes as appropriate for those materials should be used. As noted above, the TDVs 170 are formed in ohmic contact with some of the traces 150 of the metallization stack 145. At this point, the interposer 125 has yet to undergo a thinning process to reveal the TSVs 140.

Figure 11:
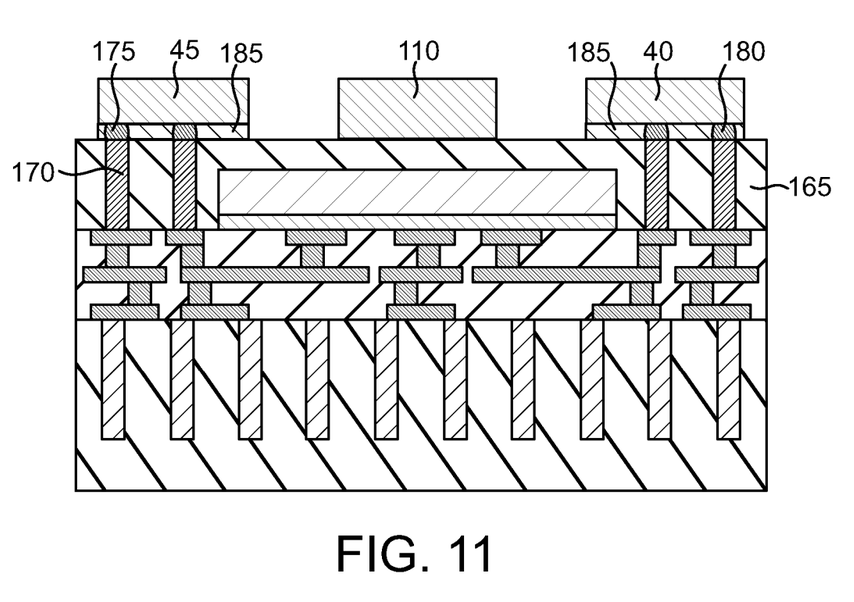
FIG. 11 is a sectional view like FIG. 10 but depicting exemplary semiconductor chip and dummy component mounting on the dielectric layer.
Figure 12:
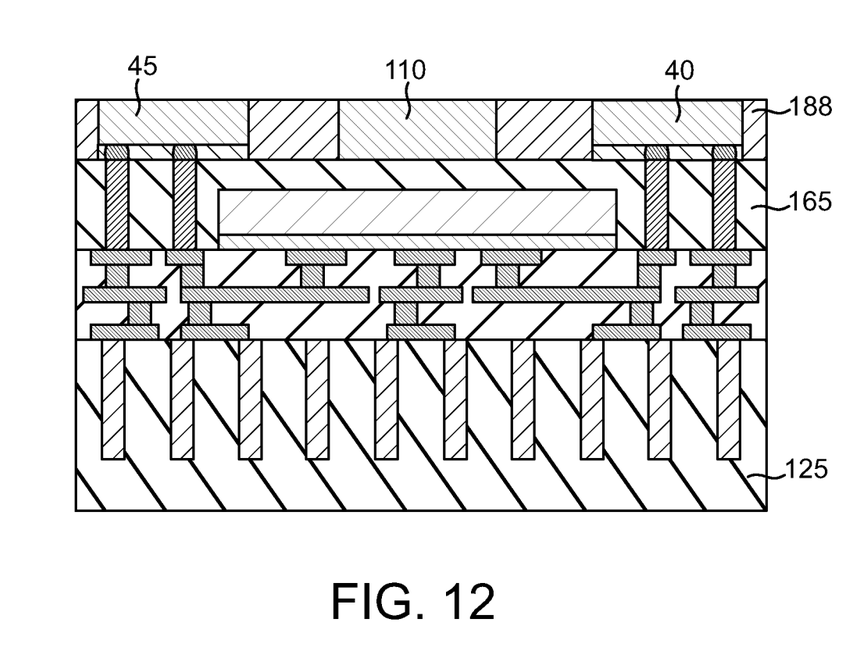
FIG. 12 is a sectional view like FIG. 11 but depicting exemplary molding layer fabrication.

Next and as shown in FIG. 11, the dummy component 110 and the semiconductor chips 40 and 45 are mounted on the dielectric layer 165. As noted above, the dummy component 110 can be attached by adhesives, oxide bonds or other types of joining techniques. The connections of the chips 40 and 45 to the dielectric film 165 entail forming the metallurgical bonds depicted above and described in conjunction with FIG. 6 such that the I/Os 175 and 180 of the chips 40 and 45 metallurgically connect to respective of the TDVs 170. The chips 40 and 45 (and the chips 30, 35, 95 and 100 shown in FIG. 3) are positioned with the desired lateral overlap with the underlying chip 25. The underfill 185 can be dispensed by capillary action or can be provided by way of the subsequently deposited molding material layer. Next and as shown in FIG. 12, the molding layer 188 is molded on the dielectric film 165 and at least partially encases the chips 40 and 45 and the dummy component 110. Of course it should be understood that the molding material 188 not only partially encases the chips 40 and 45 and the dummy component 110 visible in FIG. 12 but also the other chips 30, 35, 95, 100 and the other dummy component 105 depicted in FIG. 3. A subsequent grinding process is performed on the molding layer 188 in order to expose upper surfaces of the chips 40 and 45 and the dummy component 110 to, among other reasons, enable a heat spreader (not shown) to be mounted on and in thermal contact with the chips 40, 45 and the dummy component 110 and dummy component 105 shown in FIG. 3. Note that at this stage the interposer 125 has yet to undergo a thinning process.

Figure 13:
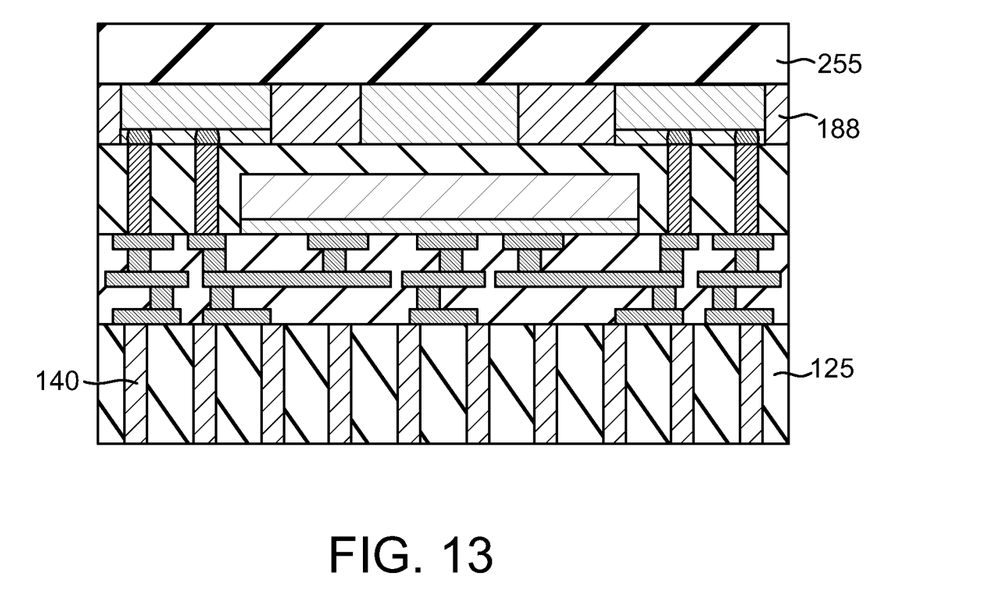
FIG. 13 is a sectional view like FIG. 12 but depicting exemplary temporary carrier wafer attachment and TSV reveal.
Figure 14:
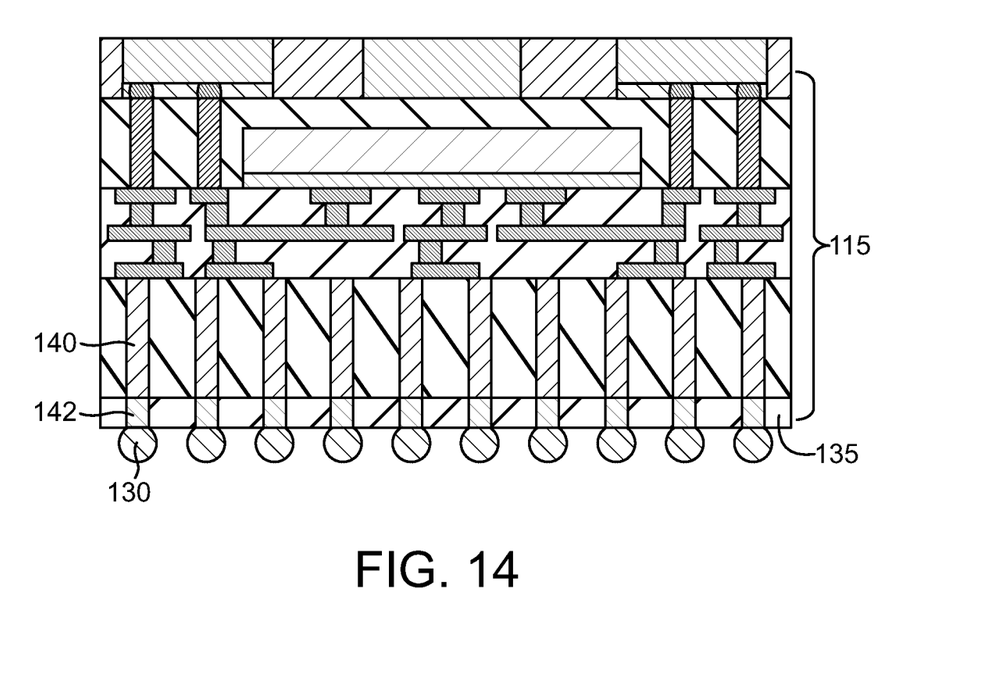
FIG. 14 is a sectional view like FIG. 13 but depicting exemplary UBM and interconnect fabrication on the interposer.

Next and as shown in FIG. 13, a temporary carrier wafer 255 is mounted to the molding layer 188 to provide structural support for the thinning of the interposer 125 necessary to reveal the TSVs 140 thereof. The carrier wafer 255 can be constructed of silicon, other semiconductors, various glasses and can be connected to the molding layer 188 by way of heat or light activated adhesives or even two-sided tape that can be undone later. Following the thinning of the interposer 125 and the reveal of the TSVs 140, the polymer layer 135 can be applied using well-known spin deposition and baking techniques. The polymer layer 135 can be constructed with photosensitive materials so that suitable openings can be lithographically patterned therein in order to facilitate the subsequent fabrication of the UBMs 142 and the connection of the I/Os 130 thereto. At this point, the reconstituted package 115 can be mounted to the circuit board 120 by placement thereon and a metallurgical reflow of the I/Os 130.

Figure 15:
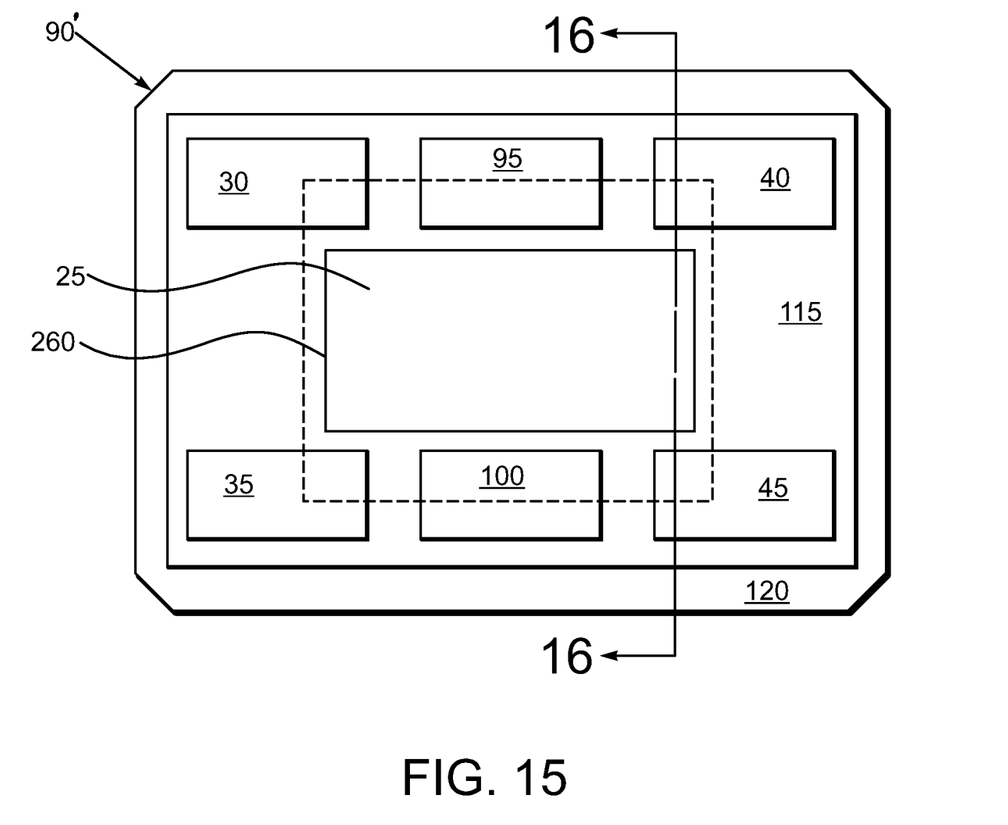
FIG. 15 is a plan view of an alternate exemplary semiconductor chip package.
Figure 16:
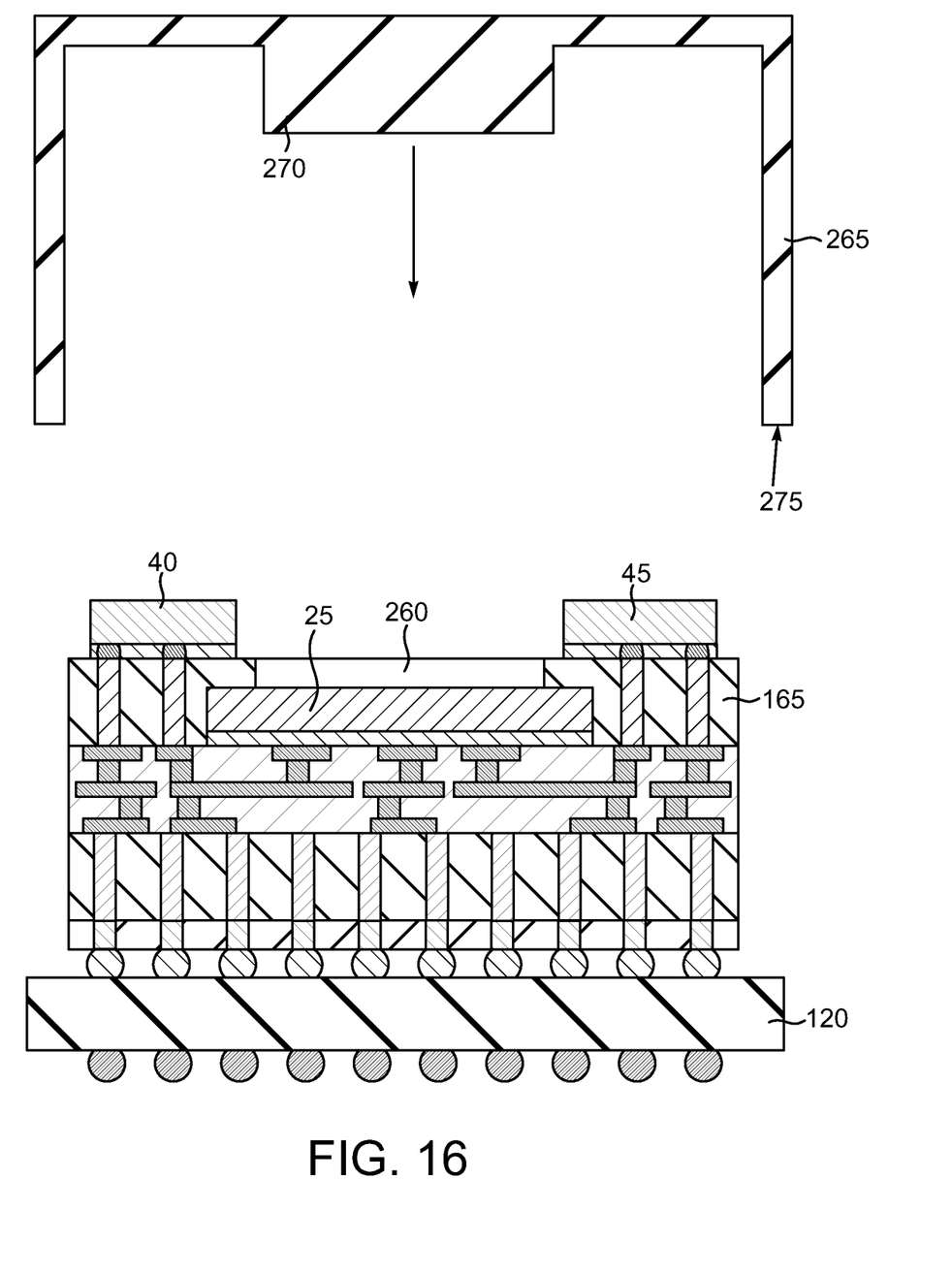
FIG. 16 is a sectional view of FIG. 15 taken at section 16-16 and including a heat spreader exploded from the chip package.

In the foregoing illustrative arrangement, the dummy components 105 and 110 provide a thermal pathway from the underlying semiconductor chip 25 to an optional heat spreader (not shown). However, the dummy components 105 and 110 can be eliminated and a thermal pathway still provided by other structures. In this regard, FIG. 15 depicts a plan view like FIG. 3 and FIG. 16 depicts a sectional view of FIG. 15 taken at section 16-16, which is essentially the same sectional location as section 4-4 shown in FIG. 4 above, of an alternate exemplary semiconductor chip device 90', which includes the aforementioned semiconductor chip 25 and the chips 30, 35, 40, 45, 95 and 100 all mounted on a reconstituted package 115 that is, in turn, mounted on the circuit board 120 as generally described above with some notable exceptions. A window 260 is formed in the uppermost portion of the reconstituted package 115 to expose a portion of the semiconductor chip 25. Note that the outline of the semiconductor chip 25 is still obscured and thus shown in dashed. The dummy components 110 and 115 are eliminated as is the aforementioned molding layer 188. To establish a thermal pathway with the semiconductor chip 25, a lid or heat spreader 265 can be mounted on the circuit board 120 and provided with a heat transfer surface 270 that projects downwardly between the semiconductor chips 40 and 45 through the window 260 formed in the dielectric film 165 of the reconstituted package 115 to establish thermal contact with the backside of the semiconductor chip 25. The lid 265 can be constructed of a variety of well-known heat spreader materials, such as, nickel jacketed copper, copper, aluminum, or other materials. The lid 265 can be secured to the package substrate 20 at a peripheral lip 275 thereof by way of suitable adhesives or even solder as desired.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A semiconductor chip device, comprising:
a reconstituted semiconductor chip package including an interposer having a first side and a second and opposite side and a metallization stack on the first side, a first semiconductor chip on the metallization stack and at least partially encased by a dielectric layer on the metallization stack, the dielectric layer including an opening adapted to have a portion of a heat spreader positioned therein to thermally contact the first semiconductor chip, and plural semiconductor chips positioned over and at least partially laterally overlapping the first semiconductor chip.

2. The semiconductor chip device of claim 1, comprising a circuit board, the reconstituted semiconductor chip package being mounted on the circuit board.

3. The semiconductor chip device of claim 2, wherein the circuit board comprises a semiconductor chip package substrate.

4. The semiconductor chip device of claim 1, comprising the heat spreader, the portion of the heat spreader being positioned in the opening to thermally contact the first semiconductor chip.

5. The semiconductor chip device of claim 4, wherein the heat spreader comprises a lid with sidewalls.

6. The semiconductor chip device of claim 1, comprising plural interconnects positioned between and electrically connecting the first semiconductor chip and the metallization stack.

7. The semiconductor chip device of claim 6, wherein each of the plural interconnects comprises a bumpless interconnect including a bond pad of the first semiconductor and a bond pad of the metallization stack bonded to and directly contacting the bond pad of the first semiconductor chip, the semiconductor chip device further comprising an insulating bonding layer physically connecting the first semiconductor chip to the metallization stack.

8. The semiconductor chip device of claim 1, wherein the interposer comprises plural through-substrate vias and the dielectric layer comprises plural through-dielectric vias.

9. The semiconductor chip device of claim 1, wherein the dielectric layer comprises an inorganic dielectric layer.

10. A semiconductor chip package, comprising:
a semiconductor chip package substrate adapted to mount in a circuit board socket; and
a reconstituted semiconductor chip package mounted on the semiconductor chip package substrate and including an interposer having a first side and a second and opposite side and a metallization stack on the first side, a first semiconductor chip on the metallization stack and at least partially encased by a dielectric layer on the metallization stack, the dielectric layer including an opening adapted to have a portion of a heat spreader positioned therein to thermally contact the first semiconductor chip, and plural semiconductor chips positioned over and at least partially laterally overlapping the first semiconductor chip.

11. The semiconductor chip package of claim 10, wherein the socket is a ball grid array (BGA) socket and the semiconductor chip package comprises a BGA.

12. The semiconductor chip package of claim 10, comprising the heat spreader, the portion of the heat spreader being positioned in the opening to thermally contact the first semiconductor chip.

13. The semiconductor chip package of claim 12, wherein the heat spreader comprises a lid with a peripheral lip seated on the semiconductor chip package substrate.

14. The semiconductor chip package of claim 10, wherein the dielectric layer comprises an inorganic dielectric layer.

15. The semiconductor chip package of claim 10, comprising plural interconnects positioned between and electrically connecting the first semiconductor chip and the metallization stack.

16. The semiconductor chip package of claim 15, wherein each of the plural interconnects comprises a bumpless interconnect including a bond pad of the first semiconductor and a bond pad of the metallization stack bonded to and directly contacting the bond pad of the first semiconductor chip, the semiconductor chip device further comprising an insulating bonding layer physically connecting the first semiconductor chip to the metallization stack.

17. The semiconductor chip package of claim 10, wherein the interposer comprises plural through-substrate vias and the dielectric layer comprises plural through-dielectric vias.

18. A method of manufacturing a semiconductor chip device, comprising:
fabricating a reconstituted semiconductor chip package including an interposer having a first side and a second and opposite side and a metallization stack on the first side, a first semiconductor chip on the metallization stack and at least partially encased by a dielectric layer on the metallization stack, the dielectric layer including an opening adapted to have a portion of a heat spreader positioned therein to thermally contact the first semiconductor chip, and plural semiconductor chips positioned over and at least partially laterally overlapping the first semiconductor chip.

19. The method of claim 18, mounting the reconstituted semiconductor chip package on a circuit board.

20. The method of claim 18, comprising positioning the portion of the heat spreader in the opening to thermally contact the first semiconductor chip.

21. The method of claim 18, wherein the dielectric layer comprises an inorganic dielectric layer.

22. The method of claim 18, comprising electrically connecting the first semiconductor chip to the metallization stack with plural bumpless interconnects and physically connecting the first semiconductor chip to the metallization stack with an insulating bonding layer.

* * * * *